(12) United States Patent
Shiraishi (10) Patent No.: US 7,345,244 B2
(45) Date of Patent: Mar. 18, 2008

(54) FLEXIBLE SUBSTRATE AND A CONNECTION METHOD THEREOF THAT CAN ACHIEVE RELIABLE CONNECTION

(75) Inventor: Satoshi Shiraishi, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 289 days.

(21) Appl. No.: 10/867,093

(22) Filed: Jun. 14, 2004

(65) Prior Publication Data

US 2005/0003153 A1    Jan. 6, 2005

(30) Foreign Application Priority Data

Jul. 4, 2003    (JP) .............................. 2003-192081

(51) Int. Cl.
*H05K 1/09*    (2006.01)

(52) U.S. Cl. ...................... 174/254; 174/261; 361/748; 29/830

(58) Field of Classification Search ................ 174/254, 174/261; 361/748–751; 29/830, 846, 842–845
See application file for complete search history.

(56) References Cited

U.S. PATENT DOCUMENTS

| 4,815,990 A | | 3/1989 | Ristedt et al. | |
| 4,950,527 A | * | 8/1990 | Yamada | 428/192 |
| 5,590,465 A | * | 1/1997 | Santo | 29/884 |
| 5,985,161 A | * | 11/1999 | Murphy | 216/20 |
| 6,317,972 B1 | * | 11/2001 | Asai et al. | 29/833 |
| 6,966,482 B2 | * | 11/2005 | Totani et al. | 228/215 |

FOREIGN PATENT DOCUMENTS

| JP | 05-243703 | | 9/1993 |
| JP | 6-334292 | * | 12/1994 |
| JP | 09-219572 | | 8/1997 |
| JP | 10040742 | | 2/1998 |
| JP | 2001-267540 | | 9/2001 |

OTHER PUBLICATIONS

Machine translation of JP 6-334292.*

* cited by examiner

*Primary Examiner*—Jeremy C Norris
(74) *Attorney, Agent, or Firm*—Ladas & Parry LLP

(57) ABSTRACT

A flexible substrate is connectable to electrodes of an external member. The flexible substrate includes a base material having flexibility and including an insulative base film and a conductive film. Lead parts are arranged on an end of the base material. Slits are formed between the lead parts.

9 Claims, 7 Drawing Sheets

FLEXIBLE SUBSTRATE AND A CONNECTION METHOD THEREOF THAT CAN ACHIEVE RELIABLE CONNECTION

BACKGROUND OF THE INVENTION

1. Field of the Invention

The present invention generally relates to flexible substrates and connection methods thereof, and more particularly, to a flexible substrate having fine-pitched lead parts and a connection method thereof.

2. Description of the Related Art

In a semiconductor device or an optical module (hereinafter collectively referred to as "electronic device") using a semiconductor photo detector such as a CCD or a CMOS and incorporated in a mobile terminal apparatus, it is necessary for an electric signal from the electronic device to be supplied to a processing circuit or a processing device installed in a main body of the mobile terminal apparatus. It is strongly desired that the size and thickness of a mobile terminal apparatus be reduced. In order to correspond to such needs, a flexible substrate is generally used for connecting the electronic device to, for example, the processing circuit. Accordingly, the flexible substrate is connected to electrodes provided in the electronic device (refer to Japanese Laid-Open Patent Application No. 2001-267540, for example).

Figure 1A:
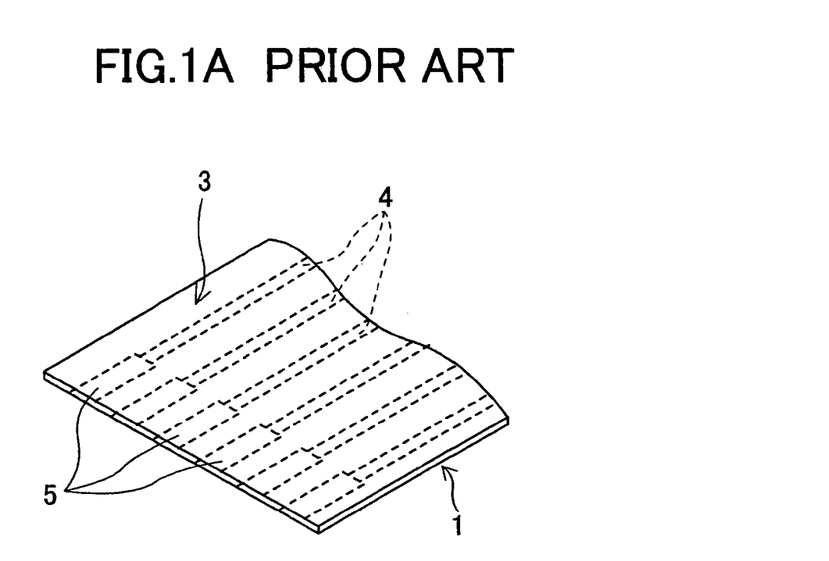
FIG. 1A is a perspective view of a conventional flexible substrate.

FIGS. 1A through 3 show the structure of a conventional flexible substrate 1 and a method of connecting the flexible substrate 1 to an electronic device 2. As shown in FIG. 1A, the flexible substrate 1 includes a base material 3, wiring 4, and lead parts 5, for example. The base material 3 is made of resin. The wiring 4 and the lead parts 5 are formed on a surface of the base material 3 that faces the electronic device 2. The lead parts 5 are formed on corresponding ends of the wiring 4, and the other ends of the wiring 4 are connected to, for example, the processing circuit.

Figure 1B:
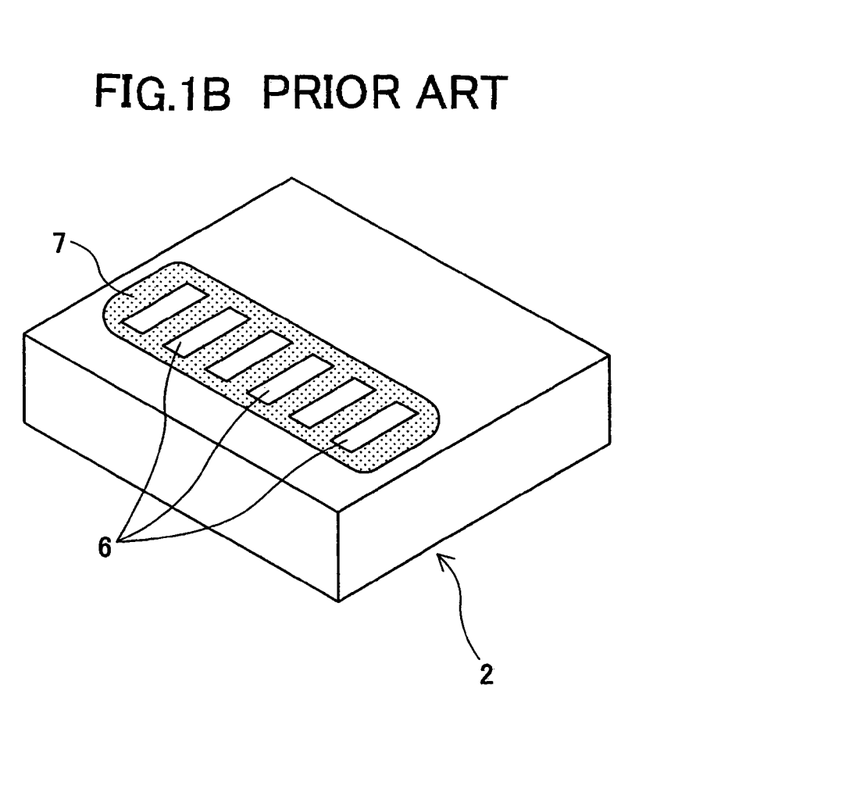
FIG. 1B is a perspective view of a conventional electronic device to be connected to the conventional flexible substrate shown in FIG. 1A.

Referring to FIG. 1B, electrodes 6 to be connected to the flexible substrate 1 are formed on the electronic device 2. The lead parts 5 formed on the flexible substrate 1 are configured to correspond to the positions at which the electrodes 6 of the electronic device 2 are formed.

Figure 2:
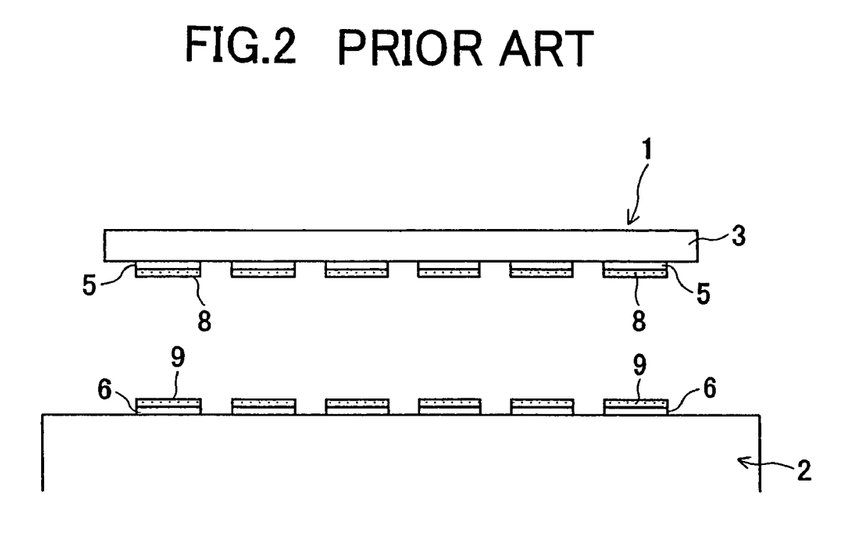
FIG. 2 is a side view for explaining a connection method for connecting the conventional flexible substrate to the electronic device shown in FIG. 1B.
Figure 3:
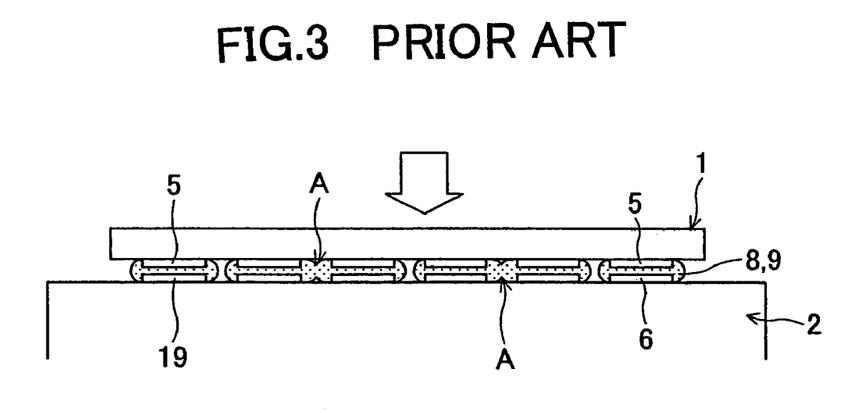
FIG. 3 is a schematic diagram for explaining a problem in the conventional flexible substrate and the connection method thereof.

When connecting the flexible substrate 1 to the electronic device 2, flux 7 is deposited in the periphery of the electrodes 6 of the electronic device 2, and solders 8 and solders 9 are formed on the lead parts 5 and the electrodes 6, respectively, as shown in FIG. 2. Then, after positioning the lead parts 5 and the electrodes 6, the flexible substrate 1 is pressed against the electronic device 2 as shown in FIG. 3 while heating the flexible substrate 1 and the electronic device 2 by using a heating tool. Consequently, the solders 8 and 9 are melted, and the lead parts 5 and the electrodes 6 are soldered.

In the conventional flexible substrate 1, however, since the lead parts 5 are formed on the tabular base material 3, there is a problem in that, when the flexible substrate 1 is pressed against the electronic device 2 while heating them by using the heating tool as shown in FIG. 3, the melted solders 8 and 9 may be shorted (may form a bridge) between the adjacent lead parts 5 or electrodes 6. In FIG. 3, the arrows A indicate the bridged portions. When such a solder bridge is formed, reliability of the connection between the flexible substrate 1 and the electronic device 2 is significantly reduced.

The solder bridge is formed for the reasons as follows. Since the base material 3 is conventionally provided on the lead parts 5, when the melted solders 8 and 9 (hereinafter referred to as "the melted solder") is pressed between the electronic device 2 and the base material 3, the melted solder can escape only in the horizontal directions in FIG. 3, i.e., the directions in which the lead parts 5 (or the electrodes 6) are adjacent.

In addition, there are variations in the amount of the solders 8 and 9 deposited on the lead parts 5 and the electrodes 6, respectively. Hence, when the amount of the solders 8 and 9 deposited on the lead parts 5 and the electrodes 6, respectively, exceeds a predetermined amount even if only slightly, the bridge is formed between the adjacent lead parts 5 and the adjacent electrodes 6 as shown in FIG. 3.

It is conceivable to use an ACF (anisotropic conductive film) instead of the solders 8 and 9. However, in the case of ACF mounting, there is a problem in that reliability of the connection is low and costs are increased compared to the case of mounting using solder.

SUMMARY OF THE INVENTION

A general object of the present invention is to provide an improved and useful flexible substrate and a connection method thereof in which one or more of the above-mentioned problems are eliminated.

Another and more specific object of the present invention is to provide a flexible substrate and a connection method thereof that can achieve a highly reliable connection.

In order to achieve the above-mentioned objects, according to one aspect of the present invention, there is provided a flexible substrate connectable to electrodes provided on an external member, the flexible substrate including:

a base material having flexibility and including an insulative base film and a conductive film;

a plurality of lead parts arranged on an end of the base material; and slits formed between the lead parts.

According to the present invention, the slits are formed between the plurality of lead parts arranged on the base material. Consequently, the base material does not exist between each of the adjacent lead parts, i.e., each of the adjacent lead parts are separated from each other. Thus, when the lead parts are soldered onto the electrodes of the external member, it is possible for solder protruding from the lead parts to escape toward the upper side of the lead parts via the slits as well as the side surfaces of the lead parts. Accordingly, it is possible to avoid formation of a bridge between the adjacent lead parts so as to improve the reliability of connection.

In an embodiment of the present invention, an adhesive member for temporarily fixing the base material to the external member may be provided at a portion of the base material which portion faces the external member.

Accordingly, before connecting the flexible substrate to the external member, it is possible to temporarily fix the base material (flexible substrate) to the external member by means of the adhesive member. Hence, it is possible to easily and positively connect the flexible substrate to the external member.

In an embodiment of the present invention, the conductive film may be formed on a first surface and a second surface of the flexible substrate, the first surface facing the external member and a second surface being opposite to the first surface.

Accordingly, it is possible to perform a soldering process on the surface of the flexible substrate opposite to the surface thereof that faces the external member, i.e., the top surface of the flexible substrate. Thus, it is possible to simplify the soldering process.

According to another aspect of the present invention, there is provided a method of connecting a flexible substrate to electrodes of an external member, the flexible substrate including: a base material having flexibility and including an insulative base film and a conductive film; a plurality of lead parts arranged on an end of the base material; and slits formed between the lead parts, the method including the steps of:

positioning the lead parts of the flexible substrate and the electrodes of the member; and performing a bonding process for bonding the lead parts to the electrodes on first surfaces of the lead parts opposite to second surfaces thereof that face the electrodes.

Accordingly, the bonding process may be performed on the surfaces of the lead parts opposite to the surfaces thereof that face the electrodes. Thus, it is possible to visually observe a bonding state between the lead parts and the electrodes via the slits. Hence, it is possible to positively determine whether a good bonding is achieved between the flexible substrate and the external member. Thus, it is possible to suppress production of defective products with faulty connection.

According to another aspect of the present invention, there is provided a method of connecting a flexible substrate to electrodes of an external member, the flexible substrate including: a base material having flexibility and including an insulative base film and a conductive film; a plurality of lead parts arranged on an end of the base material; and slits formed between the lead parts, an adhesive member for temporarily fixing the base material to the external member being provided at a portion of the base material which portion faces the external member, the method including the steps of:

bonding the flexible substrate to the external member by the adhesive member in a state where the lead parts of the flexible substrate and the electrodes of the external member are positioned; and performing a bonding process for bonding the lead parts to the electrodes on first surfaces of the lead parts opposite to second surfaces thereof that face the electrodes.

Accordingly, by bonding the flexible substrate to the external member by means of the adhesive member in a state where the lead parts and the electrodes are positioned, it is possible to perform the bonding process without considering position shift between the lead parts and the electrodes. Hence, it is possible to simplify the bonding process and to improve reliability of connection between the flexible substrate and the external member.

Other objects, features and advantages of the present invention will become more apparent from the following detailed description when read in conjunction with the following drawings.

DETAILED DESCRIPTION OF THE PREFERRED EMBODIMENTS

A description is given below of preferred embodiments of the present invention, with reference to the drawings.

Figure 4A:
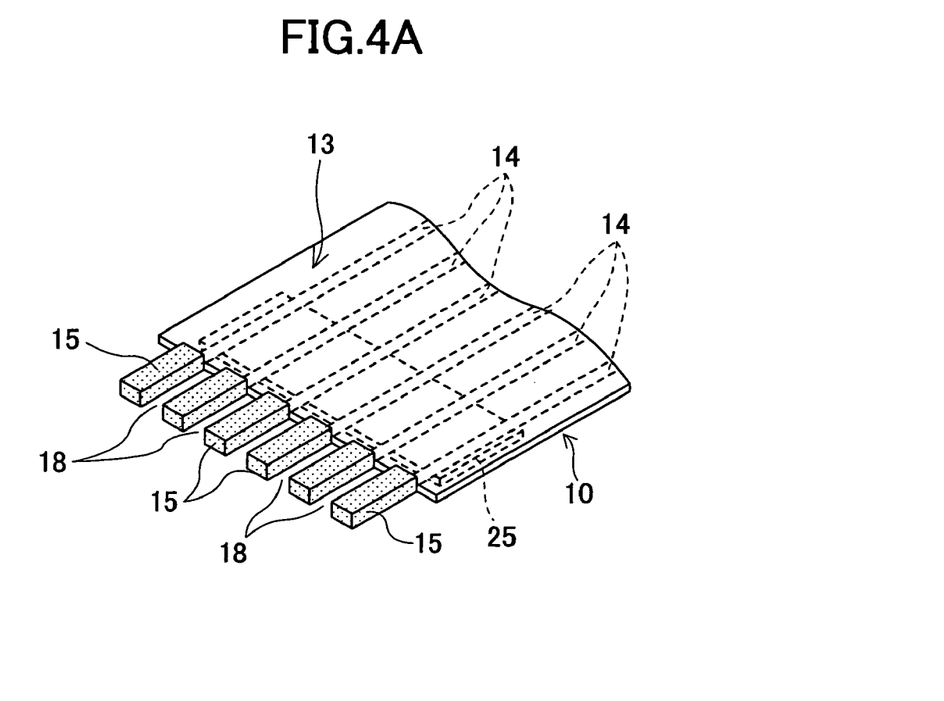
FIG. 4A is a perspective view of a flexible substrate according to one embodiment of the present invention.
Figure 4B:
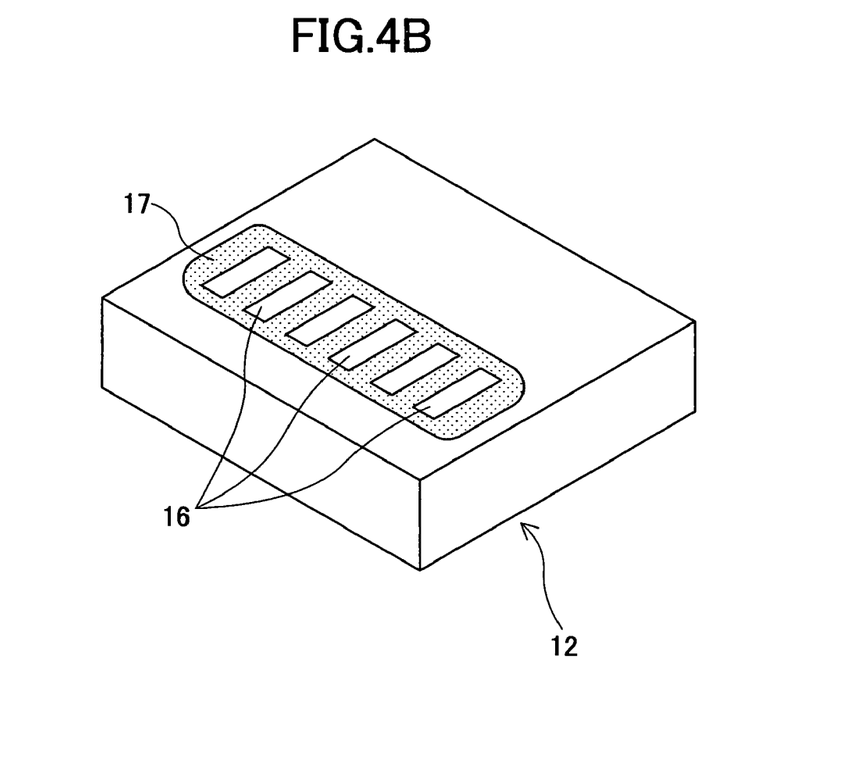
FIG. 4B is a perspective view of an electronic device to be connected to the flexible substrate shown in FIG. 4A.
Figure 5:
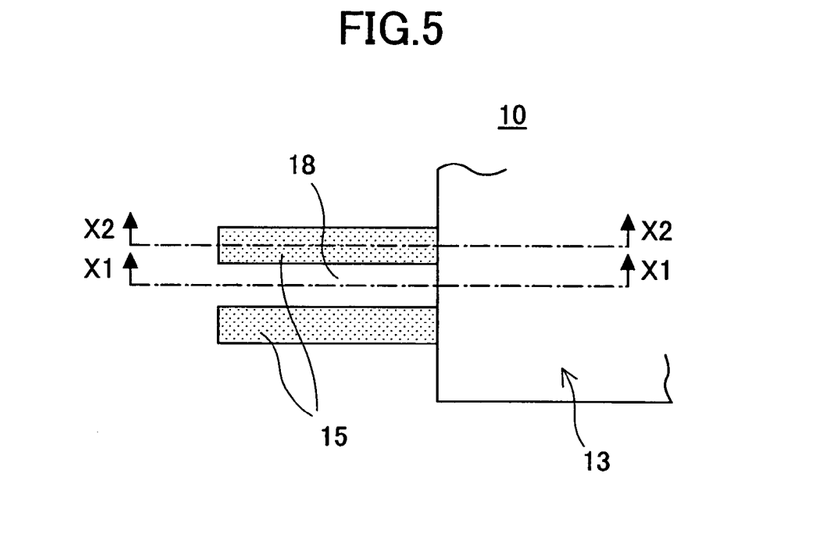
FIG. 5 is a plan view showing a part of the flexible substrate in an enlarged manner according to the embodiment of the present invention.
Figure 6:
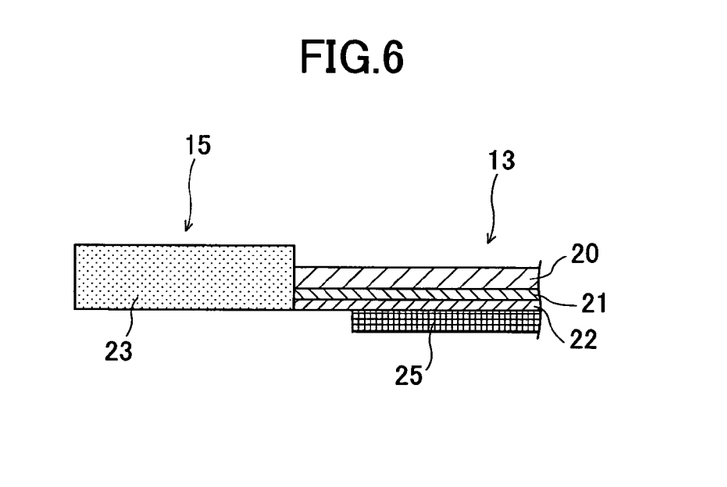
FIG. 6 is a cross-sectional view of the part of the flexible substrate taken along the line X1-X1 in FIG. 5.
Figure 7:
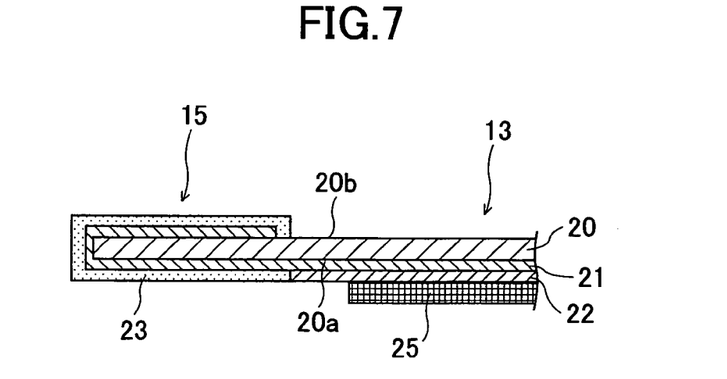
FIG. 7 is a cross-sectional view of the part of the flexible substrate taken along the line X2-X2 in FIG. 5.

FIGS. 4A through 7 are diagrams for explaining a flexible substrate 10 according to one embodiment of the present invention. FIG. 4A is a perspective view of the flexible substrate 10. FIG. 4B is a perspective view of an electronic device 12, which serves as a member connected to the flexible substrate 10. FIG. 5 is a diagram showing a part of the flexible substrate 10 in an enlarged manner. FIG. 6 is a cross-sectional view of the part of the flexible substrate 10 taken along the line X1-X1 in FIG. 5. FIG. 7 is a cross-sectional view of the part of the flexible substrate 10 taken along the line X2-X2 in FIG. 5.

The flexible substrate 10 generally includes a base material 13, lead parts 15, and a double-faced tape 25. As shown in FIGS. 6 and 7, the base material 13 is formed by depositing a conductive film 21 and a protection film 22 on a base film 20. The base film 20 is made of an insulating resin having flexibility, and polyimide or polyester, for example, may be used as the base film 20.

The conductive film 21 is made of a conductive metal and forms wiring 14 shown in FIG. 4A. Copper, for example, may be used as the conductive film 21. The conductive film 21 is formed on the base film 20 by pattern formation while using a photo-etching method or a print method. The conductive film 21 is electrically connected to the lead parts 15.

The protection film 22 is a resin film formed on the base film 20 and having an insulating property. The protection film 22 protects the conductive film 21.

The double-faced tape 25 is formed by applying an adhesive on both sides of a resin film. The double-faced tape 25 is provided on a face of the base material 13 that faces the electronic device 12. The double-faced tape 25 is provided at a position close to the lead parts 15 as shown in FIG. 4A and FIG. 8C (described later).

A plurality of the lead parts 15 are integrally formed with the base material 13. In this embodiment, the lead parts 15 are formed on an end portion of the base material 13. Slits 18 are formed between adjacent lead parts 15.

Since the slits 18 are formed, the lead parts 15 extend from the base material 13 in a cantilever manner. Thus, when the flexible substrate 10 is seen from the direction perpendicular to the base material 13, the lead parts 15 are arranged in a comb manner (refer to FIGS. 4A, 5 and 9).

Referring to FIG. 7, a detailed description is given below of the structures of the lead parts 5. The base film 20 integrally extends into the lead parts 15. Also, the conductive film 21, which forms the wiring 14, extends into the lead parts 15.

In the lead parts 15, the conductive film 21 is formed on surfaces (surfaces 20a) of the lead parts 15 facing the electronic device 2 and the surfaces (surfaces 20b) of the lead parts 15 opposite to the surface 20a. That is, in the lead parts 15, the conductive film 21 is formed on the surfaces 20a, the end portions of the lead parts 15, and the surfaces 20b.

The conductive film 21 formed in the aforementioned manner is covered by a solder film 23. The solder film 23 is formed on the side surfaces of the lead parts 15 as well as the surfaces of the conductive film 21. The solder film 23 may be formed by a plating process or a dipping process.

Figure 8A:
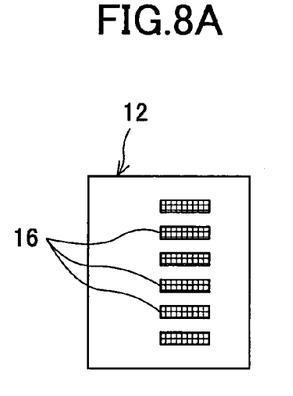
FIGS. 8A, 8B and 8C are schematic diagrams for explaining a connection method for connecting the flexible substrate to the electronic device according to the embodiment of the present invention.
Figure 8B:
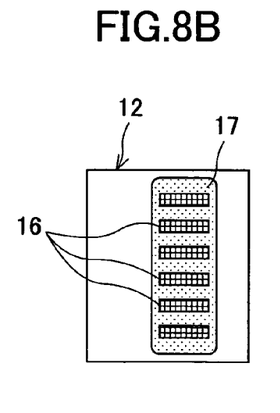
Figure 8C:
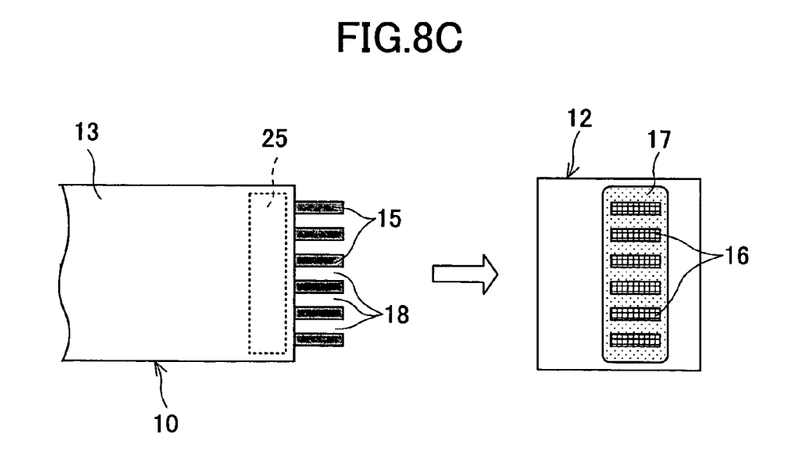
Figure 9A:
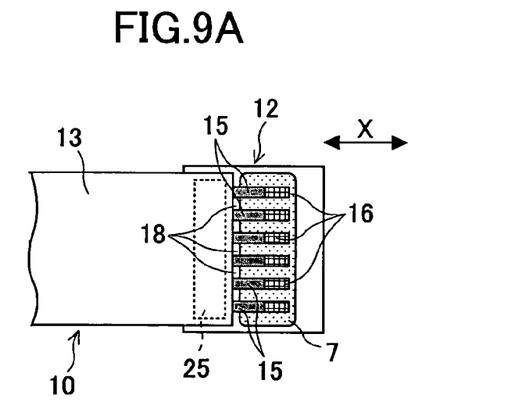
FIGS. 9A, 9B and 9C are schematic diagrams for explaining the connection method for connecting the flexible substrate to the electronic device according to the embodiment of the present invention.
Figure 9B:
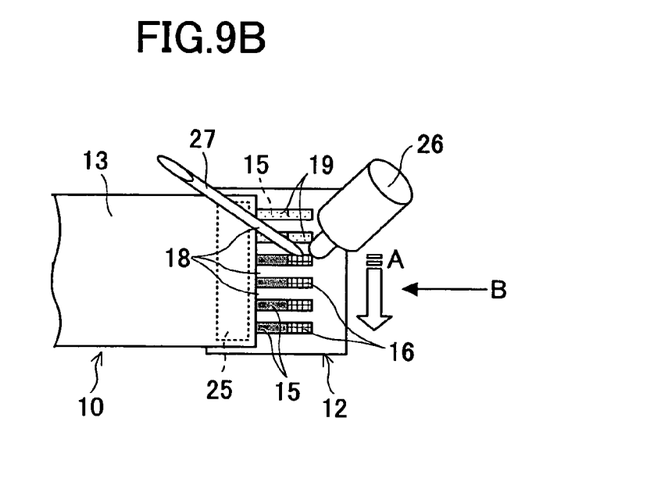
Figure 9C:
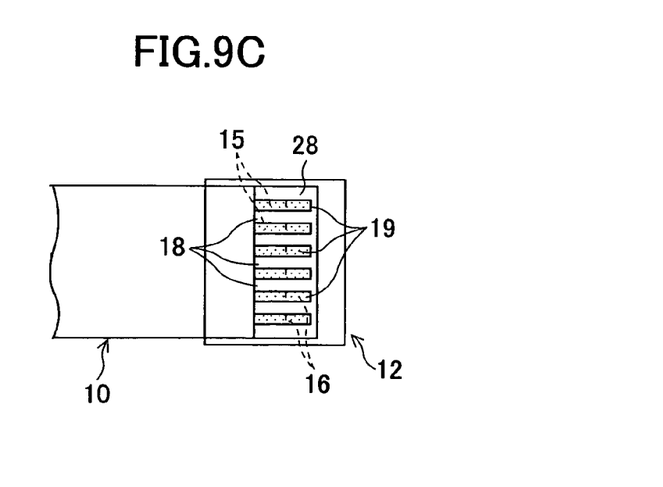

Referring to FIGS. 8 and 9, a description is given below of a connection method for connecting the flexible substrate 10 having the above-mentioned structure to the electronic device 12, which serves as the member connected to the flexible substrate 10.

As shown in FIGS. 4A and 8A, a plurality of the electrodes 16 are formed on the electronic device 12. Solder 19 is pre-coated on the electrodes 16 in advance (see FIG. 10). The lead parts 15 of the flexible substrate 10 are configured to correspond to the positions at which the electrodes 16 are formed.

When connecting the flexible substrate 10 to the electronic device 12, first, as shown in FIG. 8B, flux 17 is applied in the periphery of the electrodes 16. The flux 17 raises reliability of connection by providing good solder wettability at the time of solder bonding.

Figure 10:
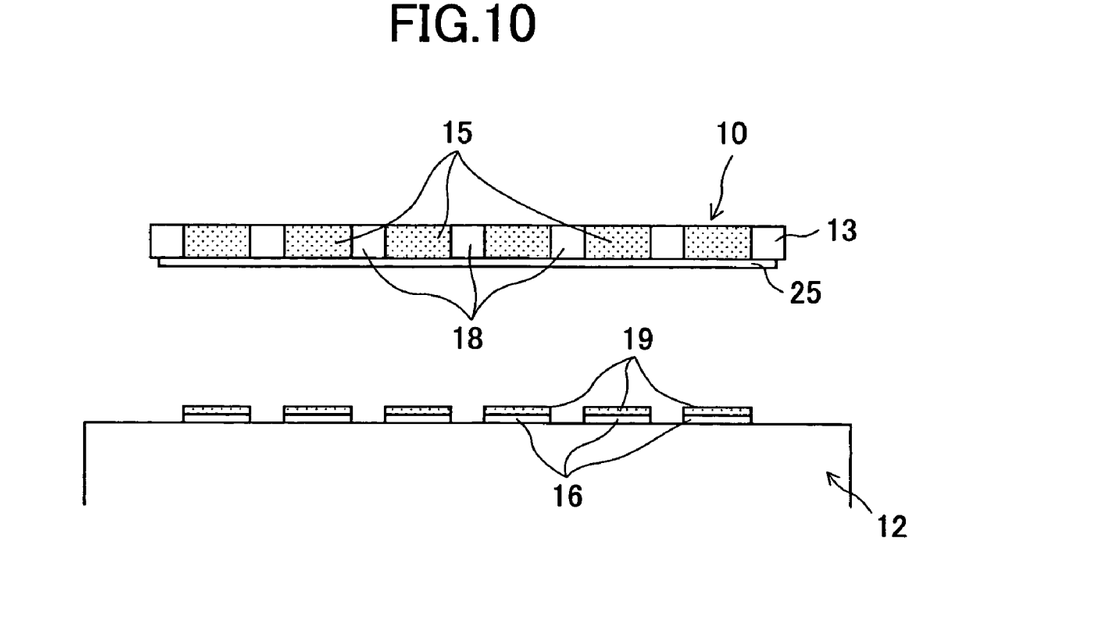
FIG. 10 is a schematic diagram for explaining the connection method for connecting the flexible substrate to the electronic device according to the embodiment of the present invention.

Then, as shown in FIGS. 8C and 10, the flexible substrate 10 is positioned above the electronic device 12. On this occasion, the flexible substrate 10 is set such that the face having the double-faced tape 25 thereon faces the electronic device 12.

After positioning the lead parts 15 and the electrodes 16, the flexible substrate 10 is pressed against the electronic device 12. Conventionally, at the time of positioning of the lead parts 5 and the electrodes 6, since the lead parts 5 are provided on the back side (the surface facing the electronic device 2) of the base material 3, it is impossible to visually check the positions of the lead parts 5 from above the flexible substrate 1 as shown in FIG. 1. Thus, it is difficult to perform positioning of the lead parts 5 and the electrodes 6.

In this embodiment, however, since the slits 18 are formed so as to form the lead parts 15 into the comb shape, it is possible to perform the positioning of the lead parts 15 and the electrodes 16 while visually checking the lead parts 15 and the electrodes 16 via the slits 18. Accordingly, by configuring the lead parts 15 into the comb shape, it is possible to easily and positively perform positioning of the lead parts 15 and the electrodes 16.

In addition, the double-faced tape 25 is provided on the flexible substrate 10 at the position facing the electronic device 12. Hence, by pressing the flexible substrate 10 against the electronic device 12, the flexible substrate 10 is temporarily fixed to the electronic device 12 via the double-faced tape 25 as shown in FIG. 9A. In the temporarily fixed state, the lead parts 15 and the electrodes 16 maintain the positions.

When the flexible substrate 10 is temporarily fixed with the lead parts 15 and the electrodes 16 being positioned in the aforementioned manner, a process of soldering the lead parts 15 to the electrodes 16 is subsequently performed. As shown in FIG. 9B, in this embodiment, a solder iron 26 and string solder 27 are used for soldering the lead parts 15 to the electrodes 16. In addition, the soldering process is performed on the surfaces (the upper surfaces) of the lead parts 15 opposite to the surfaces facing the electrodes 16, i.e., from above the lead parts 15.

In this embodiment, the lead parts 15 are formed into the comb shape by forming the slits 18. In the lead parts 15, the conductive film 21 is formed on each of the surfaces 20a and the surfaces 20b. The solder film 23 is formed so as to cover the conductive film 21 on each of the surfaces 20a and the surfaces 20b (in this embodiment, the solder film 23 covers the lead parts 15 entirely). Hence, it is possible to perform the soldering process from above the lead parts 15.

More specifically, while supplying the string solder 27 to an end portion of the solder iron 26, the solder iron 26 and the string solder 27 are moved in the direction indicated by an arrow A in FIG. 9B. Consequently, the string solder 27 heated and melted by the solder iron 26 flows toward a bonding position between the lead part 15 and the electrode 16 along the side surfaces of the lead part 15 (hereinafter the solder contributing to the solder bonding is referred to "the solder 19").

It should be noted that, at the time of the soldering process, the flexible substrate 10 and the electronic device 12 are temporarily fixed by the double-faced tape 25 as mentioned above. Hence, even if the soldering process is performed while moving the solder iron 26 and the string solder 27, it is possible to perform the bonding process without considering a position shift between the lead parts 15 and the electrodes 16. Accordingly, it is possible to simplify the bonding process and raise reliability of the connection between the flexible substrate 10 and the electronic device 12.

Figure 11:
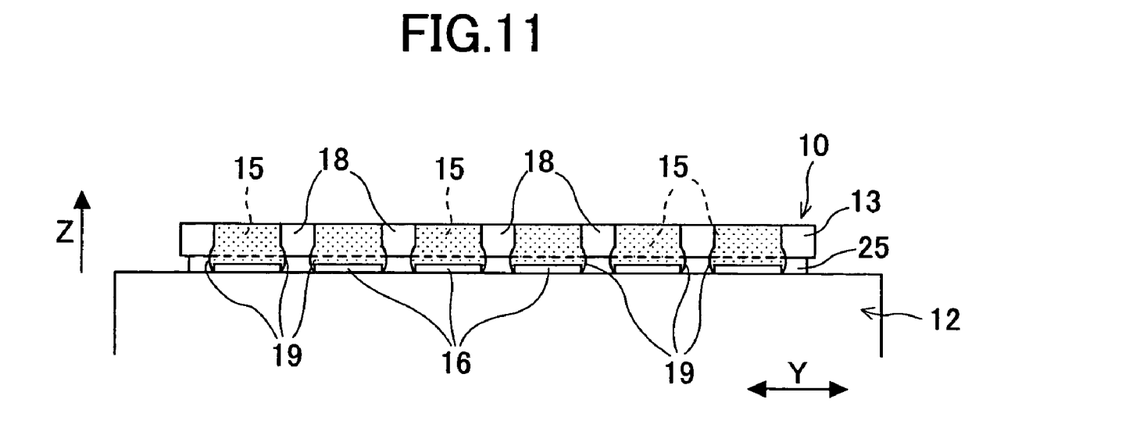
FIG. 11 is a schematic diagram for explaining the connection method for connecting the flexible substrate to the electronic device according to the embodiment of the present invention.

FIG. 11 shows a state where the lead parts 15 are bonded to the electrodes 16 by the solder 19. FIG. 11 is a side view of the lead parts 15 and the electrodes 16 seen from the direction indicated by an arrow B in FIG. 9B.

The solder 19 (the melted string solder 27) proceeds along the side surfaces of the lead parts 15, in other words, proceeds toward the bonding positions between the lead parts 15 and the electrodes 16 within the slits 18. When the solder 19 reaches the bonding positions between the lead parts 15 and the electrodes 16, the lead parts 15 are bonded to the electrodes 16 by the solder 19.

The amount of the solder 19 that reaches the bonding positions between the lead parts 15 and the electrodes 16 is not constant and varies to a certain degree. Thus, in a case where an excessive amount of the solder 19 is supplied, there is a possibility that bridges may be formed between the adjacent lead parts 15 and/or the adjacent electrodes 16.

However, in this embodiment, by providing the slits 18 at the positions between the adjacent lead parts 15, the adjacent lead parts 15 are separated from each other. Hence, even if the solder 19 excessively flows into the slits 18, it is possible for the solder 19 to flow to the upper side of the lead parts 15 (in the direction indicated by an arrow Z in FIG. 11) as well as the horizontal directions (the directions indicated by an arrow Y) of the lead parts 15 via the slits 18.

In this embodiment, since the solder film 23 is also formed on the side surfaces of the lead parts 15, the solder 19 is caused to flow to the side surfaces of the lead parts 15 by surface tension of the solder film 23. Consequently, even if the lead parts 15 and the electrodes 16 are finely pitched, it is possible to avoid formation of bridges between the adjacent lead parts 15 and/or the adjacent electrodes 16. Thus, it is possible to improve the reliability of connection.

In addition, in this embodiment, the soldering process is performed from above the lead parts 15. Hence, even if an excessive amount of the solder 19 is supplied and a bridge is formed between the adjacent lead parts 15 and/or the adjacent electrodes 16, it is possible to visually observe the formation of the bridge via the slits 18. For this reason, it is possible to positively determine whether a good bonding state is achieved between the flexible substrate 10 and the electronic device 12. Thus, it is possible to suppress production of defective products with faulty connections.

Further, as shown in FIGS. 9A and 9B, in the state where the lead parts 15 and the electrodes 16 are positioned, the lead parts 15 are shifted by a small amount from the electrodes 16 in the directions indicated by an arrow X in FIG. 9A. Accordingly, a part of the electrodes 16 are exposed outside in the state where the lead parts 15 and the electrodes 16 are positioned.

In this embodiment, the solder 19 is supplied also to the exposed parts of the electrodes 16, and soldering of the lead parts 15 is performed also with respect to the exposed parts (see FIG. 9B). Hence, it is possible to more positively bond the lead parts 15 to the electrodes 16.

When the soldering process ends, as shown in FIG. 9C, an insulating film 28 is formed so as to cover the soldering position of the lead parts 15 and the electrodes 16. Upon formation of the insulating film 28, the connection process in which the flexible substrate 10 is connected to the electronic device 12 is completed.

In the above-mentioned embodiment, position shift between the lead parts 15 and the electrodes 16 is avoided by providing the double-faced tape 25. The bonding process of the flexible substrate 10 and the electronic device 12 may be performed without using the double-faced tape 25. However, in light of improvement of workability and prevention of position shift, it is preferable that the double-faced tape 25 be provided.

According to the present invention, it is possible to prevent formation of bridges between the adjacent lead parts 15 and improve reliability of connection.

In an embodiment of the present invention, before connecting the flexible substrate 10 to the member to be connected to the flexible substrate 10 (the electronic device 12), the base material 13 (the flexible substrate 10) and the member may be temporarily fixed by the adhesive member (the double-faced tape 25). Accordingly, it is possible to easily and positively perform the process of connecting the flexible substrate 10 to the member (the electronic device 12).

In an embodiment of the present invention, the bonding process may be performed from above the flexible substrate 10. Accordingly, it is possible to simplify the bonding operation.

In an embodiment of the present invention, it is possible to visually observe a bonding state via the slits 18. Hence, it is possible to positively determine whether a good boding state is achieved between the flexible substrate 10 and the member (the electronic device 12) to be connected to the flexible substrate 10.

In an embodiment of the present invention, it is possible to perform the bonding process without considering position shift between the lead parts 15 and the electrodes 16. Hence, it is possible to simplify the bonding process and improve reliability of the connection between the flexible substrate 10 and the member (the electronic device 12) to be connected to the flexible substrate 10.

The present invention is not limited to the specifically disclosed embodiments, and variations and modifications may be made without departing from the scope of the present invention.

The present application is based on Japanese priority application No. 2003-192081 filed on Jul. 4, 2003, the entire contents of which are hereby incorporated by reference.

What is claimed is:

1. A flexible substrate connectable to electrodes provided on an external member, said flexible substrate comprising:
   a base material having flexibility and including an insulative base film and a conductive film;
   a plurality of lead parts arranged at an end of the base material, each lead part having a first surface and an opposing second surface and having an end surface extending between the first and second opposing surfaces; and
   slits formed between and separating the lead parts;
   wherein each of the lead parts are cantilevered from the base material such that each lead part has a free end away from the base material, the lead parts having a conductive film integrally formed over the first and second opposing surfaces of the lead parts, the conductive film also being formed on at least one of a first surface and a second surface of the flexible substrate, the first surface of the lead part facing the external member;
   a solder film formed over the conductive film on the first and second surfaces of the lead part and enclosing the end surface of the lead part; and
   wherein a non-solder adhesive member for temporarily fixing the base material to the external member is provided at a portion of the base material, which portion faces the external member.

2. A method of connecting conductors of a flexible substrate to electrodes of an external member, the flexible substrate including: a base material having flexibility and including an insulative base film and a conductive film; a plurality of cantilevered lead parts arranged at an end of the base material; and slits formed between and separating the cantilevered lead parts from each other, the cantilevered lead parts having opposing first and second surfaces and an end surface extending between the first and second opposing surfaces, the cantilevered lead parts also having a conductive film formed over the first and second opposing surfaces and over at least part of the end surfaces the lead parts also having a solder film formed over the conductive film, said method comprising the steps of:
   positioning the lead parts of the flexible substrate and the electrodes of the member;
   temporarily fixing the base material to the external member using a non-solder adhesive member that is provided at a portion of the base material, which faces the external member; and performing a bonding process for bonding the first surfaces of the cantilevered lead parts to electrodes of the external member using at least part of the solder film on the lead parts.

3. The method as claimed in claim 2, wherein the adhesive member provided at a portion of the base material is an adhesive tape for temporarily fixing the base material to the external member, provided at a portion of the base material which portion faces the external member.

4. The method as claimed in claim 3, wherein the conductive film is formed on a first surface and a second surface of the flexible substrate, the first surface facing the external member and a second surface being opposite to the first surface.

5. The method as claimed in claim 2, wherein the conductive film is formed on a first surface and a second surface of the flexible substrate, the first surface facing the external member and a second surface being opposite to the first surface.

6. A method of connecting a flexible substrate to electrodes of an external member, the flexible substrate including:
   a base material having flexibility and including an insulative base film and a conductive film over the insulative base film;
   a plurality of cantilevered lead parts formed from the base material, the lead parts being formed by and spaced apart from each other by slits between the lead pads, each of the cantilevered lead parts extending from an end of the base material to have a free end; and
   a non-solder adhesive member for temporarily fixing the base material to the external member, the non-solder adhesive member being provided at a portion of the base material that faces the external member, said method comprising the steps of:
   temporarily attaching the flexible substrate to the external member by the non-solder adhesive member such that the lead parts of the flexible substrate and the electrodes of the external member are substantially aligned with respect to each other; and
   bonding the free end of the lend parts to the electrodes using solder film on surfaces of the lead parts that face the electrodes.

7. The method as claimed in claim 6, wherein the conductive film is formed on a first surface and a second surface of the flexible substrate, the first surface facing the external member and a second surface being opposite to the first surface.

8. A flexible substrate connectable to electrodes provided on an external member, said flexible substrate comprising:
   a flexible base material comprised of an insulative base film having first and second opposing surfaces;
   a plurality of cantilevered flexible lead parts formed and separated from each other by slits in the base material such that the lead parts extend from an end of the flexible base material, each flexible lead part forming a separate flexible cantilever having first and second opposing surfaces and an end surface, which extends between the first and second opposing surfaces of the lead part;
   a conductive film formed over at least part of the first and second opposing surfaces of the flexible substrate and over the first and second opposing surfaces of the flexible cantilevered lead part;
   a solder film formed over the first and second opposing surfaces of the flexible cantilevered lead parts and over the end surface of the lead parts;
   wherein the free end of a cantilevered lead part remains free and cantilevered from the end of the flexible base material until the lead part is attached to an external member by solder film on the lead part; and
   wherein a non-solder adhesive member for temporarily fixing the base material to the external member is provided at a portion of the base material, which portion faces the external member.

9. The flexible substrate of claim 8 wherein the conductive film also extends over the end of the flexible base.

* * * * *